United States Patent [19]
Franaszek et al.

[11] Patent Number: 5,870,036
[45] Date of Patent: *Feb. 9, 1999

[54] ADAPTIVE MULTIPLE DICTIONARY DATA COMPRESSION

[75] Inventors: Peter Anthony Franaszek, Mt. Kisco; John Timothy Robinson, Yorktown Heights; Joy Aloysius Thomas, White Plains, all of N.Y.

[73] Assignee: International Business Machines Corporation, Armonk, N.Y.

[*] Notice: The terminal 17 months of this patent has been disclaimed.

[21] Appl. No.: 393,967

[22] Filed: Feb. 24, 1995

[51] Int. Cl.⁶ ........................................... H03M 7/00
[52] U.S. Cl. ............................................... 341/51
[58] Field of Search .................. 341/51, 65, 59, 341/106, 107

[56] References Cited

U.S. PATENT DOCUMENTS 5,204,756  4/1993  Chevion et al. .
5,389,922  2/1995  Serussi et al. .......................... 341/51
5,467,087  11/1995  Chu ........................................ 341/51

Primary Examiner—Brian K. Young
Attorney, Agent, or Firm—Richard M. Ludwin; Heslin & Rothenberg, P.C.

[57] ABSTRACT

A system and method for compressing and decompressing data using a plurality of data compression mechanisms. Representative samples of each block of data are tested to select an appropriate one of the data compression mechanisms to apply to the block. The block is then compressed using the selected one of the mechanisms and the compressed block is provided with an identifier of the selected mechanism. For decompression, the identifier is examined to select an appropriate one of the data decompression mechanisms to apply to the block. The block is then decompressed using the selected one of the mechanisms.

17 Claims, 9 Drawing Sheets

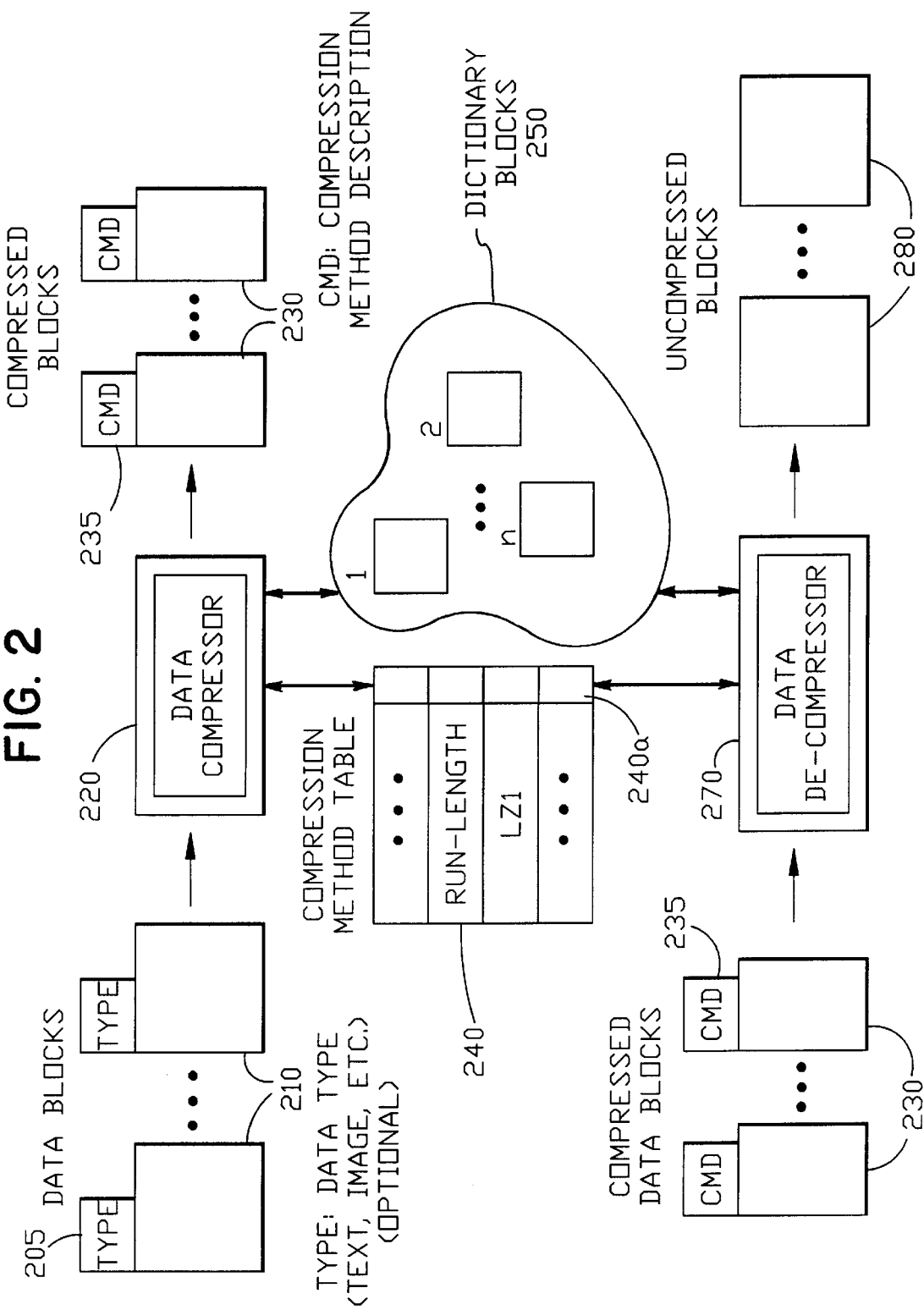

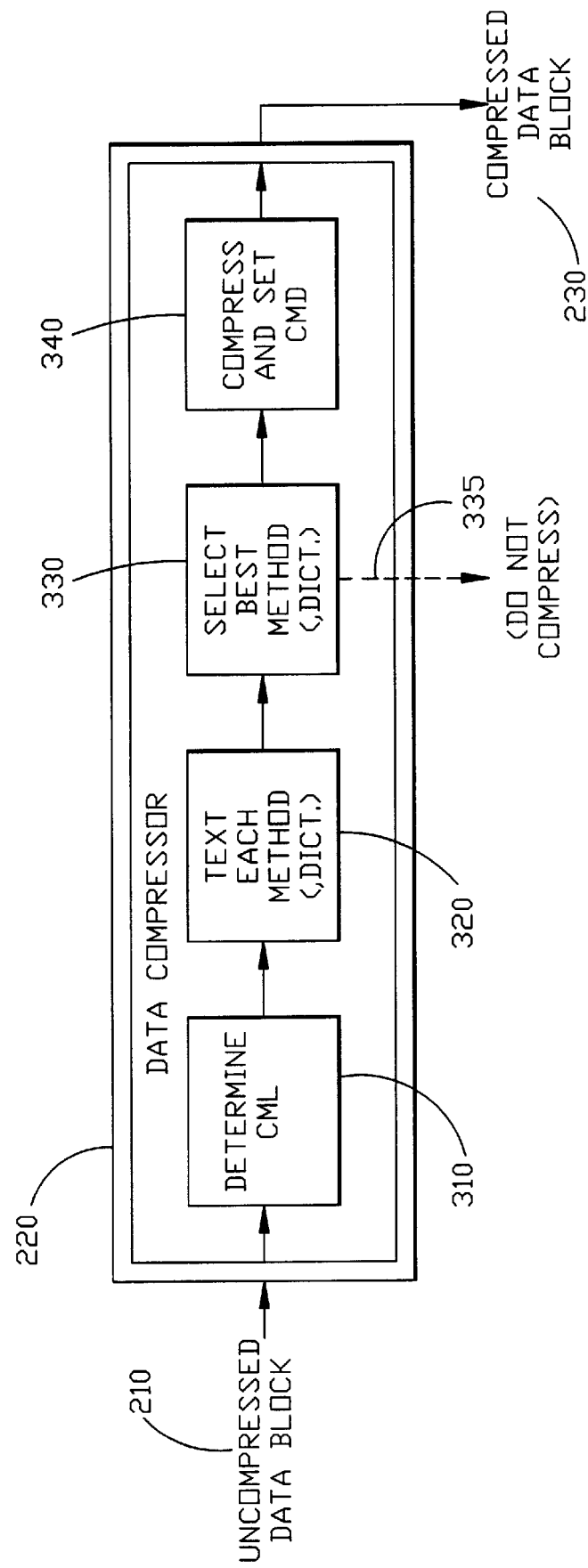

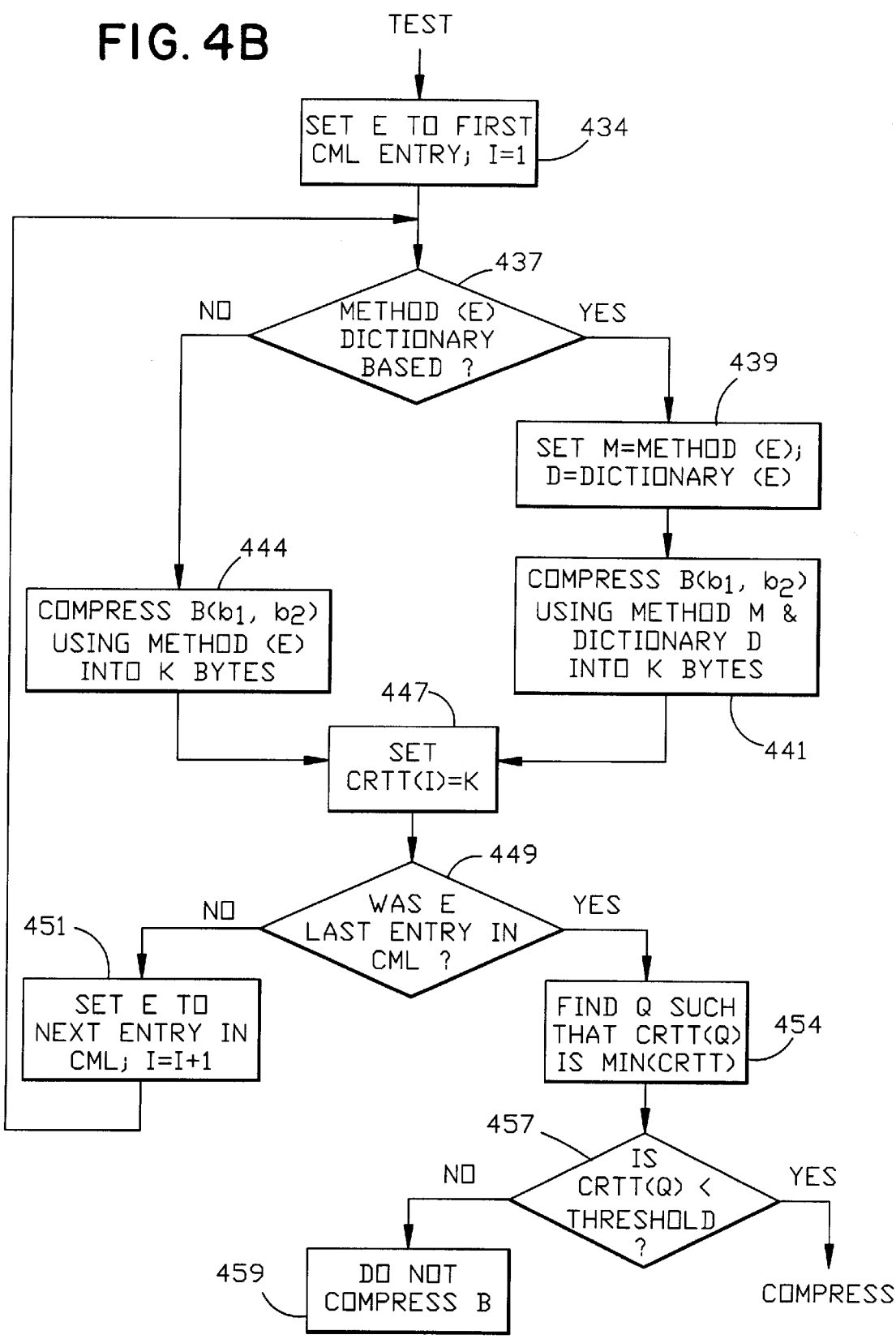

ADAPTIVE MULTIPLE DICTIONARY DATA COMPRESSION

I. BACKGROUND OF THE INVENTION

1. Field of the Invention

This invention relates in general to data processing systems and, more specifically, to a system and method for compressing data.

2. Background of the Invention

In general, data compression involves taking a stream of symbols and transforming them into codes. If the compression is effective, the resulting stream of codes will be smaller than the original symbol stream. The decision to output a certain code for a certain symbol or set of symbols is based on a model. The model is simply a collection of data and rules used to process input symbols and determine which code(s) to output. A computer program may use the model to accurately define the probabilities for each symbol in order to produce an appropriate code based on those probabilities.

Data compression techniques often need to be lossless (without incidences of error or loss of data). Exceptions to this include, for example, certain applications pertaining to graphic images or digitized voice. Lossless compression consists of those techniques guaranteed to generate an exact duplicate of the input data stream after a compress/expand cycle. This is the type of compression often used when storing database records, spreadsheets, or word processing files. In these applications, the loss of even a single bit can be catastrophic.

Lossless data compression is generally implemented using one of two different types of modeling: statistical or dictionary-based. Statistical modeling reads in and encodes a single symbol at a time using the probability of that character's appearance. Statistical models achieve compression by encoding symbols into bit strings that use fewer bits than the original symbols. The quality of the compression goes up or down depending on how good the program is at developing a model. The model has to predict the correct probabilities for the symbols. The farther these probabilities are from a uniform distribution, the more compression that can be achieved.

In dictionary-based modeling, the coding problem is reduced in significance, making the model supremely important. The dictionary-based compression processes use a completely different method to compress data. This family of processes does not encode single symbols as variable-length bit strings; it encodes variable-length strings of symbols as single pointers. The pointers form an index to a phrase dictionary. If the pointers are smaller than the phrases they replace, compression occurs. In many respects, dictionary-based compression is easier for people to understand. In every day life, people use phone numbers, Dewey Decimal numbers, and postal codes to encode larger strings of text. This is essentially what a dictionary-based encoder does.

In general, dictionary-based compression replaces phrases with pointers. If the number of bits in the pointer is less than the number of bits in the phrase, compression will occur. However, the methods for building and maintaining a dictionary are varied.

A static dictionary is built up before compression occurs, and it does not change while the data is being compressed. For example, a database containing all motor-vehicle registrations for a state could use a static dictionary with only a few thousand entries that concentrate on words such as "Ford," "Jones," and "1994." Once this dictionary is compiled, it is used by both the encoder and the decoder as required.

There are advantages and disadvantages to static dictionaries. Nevertheless, dictionary-based compression schemes using static dictionaries are mostly ad hoc, implementation dependent, and not general purpose.

Many of the well-known dictionary-based processes are adaptive. Instead of having a completely defined dictionary when compression begins, adaptive schemes start out either with no dictionary or with a default baseline dictionary. As compression proceeds, the processes add new phrases to be used later as encoded tokens.

For a further discussion of data compression in general, please refer to *The Data Compression Book*, by Mark Nelson, © 1992 by M&T Publishing, Inc., which is hereby incorporated by reference herein.

As mentioned, the history of past symbols of a sequence often provides valuable information about the behavior of the sequence in the future. Various universal techniques have been devised to use this information for data compression or prediction. For example, the Lempel-Ziv ("LZ") compression process, which is discussed within *Compression of Individual Sequences by Variable Rate Coding*, by J. Ziv and A. Lempel, IEEE Trans. Inform. Theory, IT-24: 530–536, 1978 (which is incorporated by reference herein), uses the past symbols to build up a dictionary of phrases and compresses the string using this dictionary. As Lempel and Ziv have shown, this process is universally optimal in that the compression ratio converges to the entropy for all stationary ergodic (of or related to a process in which every sequence or sizeable sample is equally representative of the whole) sequences. Thus, given an arbitrarily long sequence, such compression operates as well as if the distribution of the sequence was known in advance.

The Lempel-Ziv compression method has achieved great popularity because of its simplicity and ease of implementation (actually, Lempel-Ziv is often used to denote any dictionary based universal coding scheme, as a result, the standard method described herein is only one of this large class). It asymptotically achieves the entropy limit for data compression. However, the rate of convergence may be slow and there is scope for improvement for short sequences. In particular, at the end of each phrase, the process returns to the root of the phrase tree, so that contextual information is lost. One approach to this problem was suggested by Plotnik, Weinberger and Ziv for finite state sources, as described within *Upper Bounds on the Probability of Sequences Emitted by Finite-State Sources and on the Redundancy of the Lempel-Ziv Algorithm*, by E. Plotnik, M. J. Weinberger and J. Ziv, IEEE Trans. Inform. Theory, IT-38(1): 66–72, January 1992, which is incorporated by reference herein. Their idea was to maintain separate LZ like trees for each source state (or estimated state) of a finite state model of the source. Plotnik, Weinberger and Ziv showed that this procedure is asymptotically optimal.

U.S. patent application Ser. No. 08/253,047, filed on Jun. 2, 1994 and assigned to the same assignee as the present invention describes a compression system wherein contextual information is implemented in conjunction with a dictionary-based compression process within a data processing system. Before encoding a next phrase within an input string of data, the compression system, through dynamic programming, derives the statistically best set of dictionaries for utilization in encoding the next phrase. The selection of this set of dictionaries is dependent upon each dictionary's past utilization within the process. Thus, the choice of dictionaries is directly related to each of their performance on compression, and not on a presumed model for the sequence as is required in a compression technique utilizing a state machine description of the source, which is available to both the encoder and decoder. The selected set of dictionaries is implemented by the data processing system to encode the next phrase of data. The context of the phrase is used to select a particular dictionary within the selected set for the encoding process, which computes a pointer to the phrase within the dictionary that corresponds to the next phrase.

The above-technique has the property that the compressor and de-compressor can each compute from the preceding string, the dictionary which will be used for the next phrase. This has the advantage that the identity of the dictionary need not be included. However, the chosen dictionary may not in fact be the best one to use, as the decision of which to use is based on estimates. Further, in some cases improved compression could result from using other types of compression techniques.

II. SUMMARY OF THE INVENTION

It is an object of this invention to dynamically compress data blocks by using the best of a given set of methods, and for dictionary-based compression, by using the best of a given set of dictionaries.

In accordance with one aspect of the present invention, there is provided a system and method for compressing data using a plurality of data compression mechanisms. Representative samples of each block of data are tested to select an appropriate one of the data compression mechanisms to apply to the block. The block is then compressed using the selected one of the mechanisms and the compressed block is provided with an identifier of the selected mechanism.

In accordance with another aspect of the present invention there is provided a system and method for decompressing data. using a plurality of data decompression mechanisms. Each block of data includes a coding identifier which is indicative of the method or mechanism used to compress the block. The coding identifier is examined to select an appropriate one of the data decompression mechanisms to apply to the block. The block is then decompressed using the selected one of the mechanisms.

III. BRIEF DESCRIPTION OF THE DRAWING

FIG. 2 shows a data compressor and data de-compressor 270 in accordance with the principles of the present invention;

FIG. 3 shows the overall structure of the data compressor of FIG. 2;

FIGS. 4A, 4B and 4C are a flow chart of the operation of the data compressor of FIG. 3;

Like reference numerals appearing in multiple figures represent like elements.

IV. DETAILED DESCRIPTION OF THE PREFERRED EMBODIMENT

Figure 1:
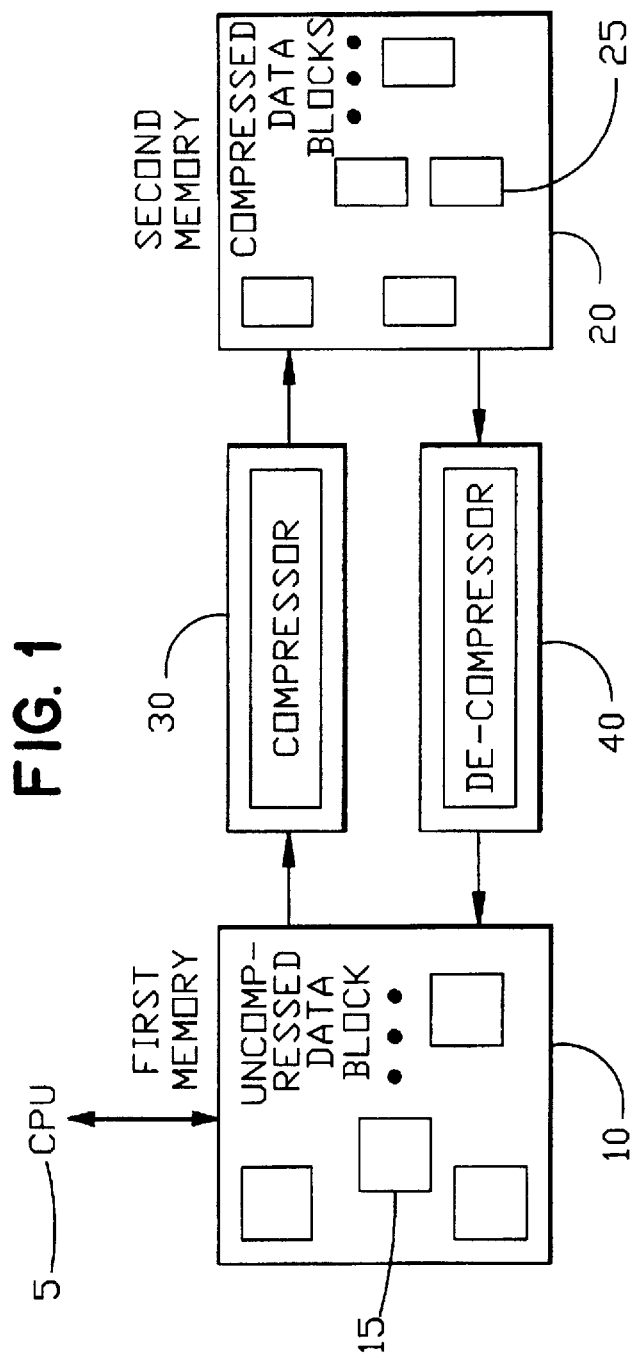
FIG. 1 shows a system structure suitable for use in conjunction with the present invention.

A system structure suitable for use in conjunction with the present invention is shown in FIG. 1. The system includes a CPU 5 which accesses a first memory 10 containing uncompressed data blocks 15. Within the same information processing system as the CPU 5 or within another "remote" system, there is a second memory 20. The memories 10, 20 can be semiconductor memories, magnetic storage (such as a disk or tape), optical storage or any other suitable type of information storage media. The data blocks are transferred between the first and second memories.

To increase the number of data blocks that can be stored in the second memory 20 given a fixed second memory size, data blocks 25 may be stored in a compressed format in the second memory. For this purpose there is a compressor 30 that compresses data blocks as they are transferred to the second memory, and a de-compressor 40 that de-compresses data blocks as they are transferred to the first memory.

In the present description, the word "coding" is used to refer generically to any of encoding (compressing) or decoding (decompressing). The word "CODEC" refers to an apparatus that performs both encoding and decoding.

FIG. 2 shows a data compressor 220 and data de-compressor 270 which operate in accordance with the principles of the present invention. The data compressor 220 and de-compressor 270 and the associated logic take the places of, respectively, the compressor 30 and decompressor 40 of FIG. 1. In this embodiment, the uncompressed data blocks 210 that can optionally contain type information 205. The type information can be, for examples, image data encoded in a given format, source code for a given programming language, etc. The data blocks 210 are input to the data compressor 220.

The data compressor 220 and data de-compressor 270 share a compression method table 240 and a memory 250 containing a number of dictionary blocks 1,2,n. It should be understood that the table 240 and the memory 250 can each be a single shared entity or, alternatively, can be duplicated such that one of each is located locally at the data compressor 220 and the data decompressor 270. The compression method table 240 can include, for example, of an array of pointers to compression routines or device address of compression/decompression hardware components. Each method entry in the table 240 includes an identifier 240a indicated whether the method is non-dictionary-based or dictionary-based.

Dictionary blocks are identified by an index specifying the offset of the block in the dictionary block memory. As explained more fully below, the compressor 220 selects a compression method. For dictionary-based methods the compressor 220 also selects a dictionary block, to compress the data. The compressor outputs compressed data blocks 230, with an index (M) 232 identifying the selected compression method, and for dictionary-based methods, dictionary block identifier (D), encoded in a compression method description (CMD) area 235 in the compressed block.

The use of a dictionary for data compression and decompression is well known in the art and described, for example, in U.S. patent application Ser. No. 08/253,047, filed on Jun. 2, 1994 and in U.S. Pat. No. 4,814,746, both of which are incorporated by reference herein as if printed in full below.

Compressed data blocks 230, with the compression method identifier M and for dictionary-based methods dictionary block identifier D encoded in the CMD area 235 are input to the de-compressor 270. The de-compressor 270 de-compresses the block using the specified method found in the compression method table 240 (using the compression method identifier as an index), and for dictionary-based methods, specified dictionary block found in the dictionary block memory 250, and outputs uncompressed data blocks 280.

FIG. 3 shows the overall structure of the data compressor 220. Each component is explained more fully below. Given an uncompressed block 205 as input, first, in block 310, a compression method list (CML) is determined. The CML is an array of entries of the form M or (M,D), where the latter form is used for dictionary-based methods. M is an index into the compression method table 240 previously described with respect to FIG. 2, and D is a dictionary block identifier for a dictionary block contained in the dictionary block memory 250, also previously described with respect to FIG. 2.

Next, in block 320, each method or (method,dictionary) pair is tested on a sample taken from the uncompressed data block 205, and the resulting sample compression is saved. In block 330, the best method or (method,dictionary) pair is found (i.e., the one giving the most compression). The best method is readily determined by comparing the size of the uncompressed same to the size of the compressed sample for each method. In a preferred embodiment, the size of the sample block as compressed by each of a number of methods is stored in a table and the best method is determined by examining the table to find the smallest compressed block. If the best sample compression does not satisfy a threshold condition (e.g. 30% compression as compared to the uncompressed sample), then it is decided at this point not to compress the block as indicated by 335. In this case the block will be stored in uncompressed format. Otherwise, in block 340, the block is compressed using the best method (and if applicable dictionary) found in block 330, the method or (method,dictionary) pair is encoded in the CMD area 235 of the block, and the compressed data block 230 results as output.

For dictionary compression methods, one way to test a representative sample is to determine the compression ratios of a given number (e.g. 30) phrases. It should be understood that all of the phrases could be tested. For symbol based compression (such as Huffman or Arithmetic coding) the compression of a given number (e.g. 150) or percentage (e.g. 10% to 20%) of the symbols can be tested.

Figure 4A:
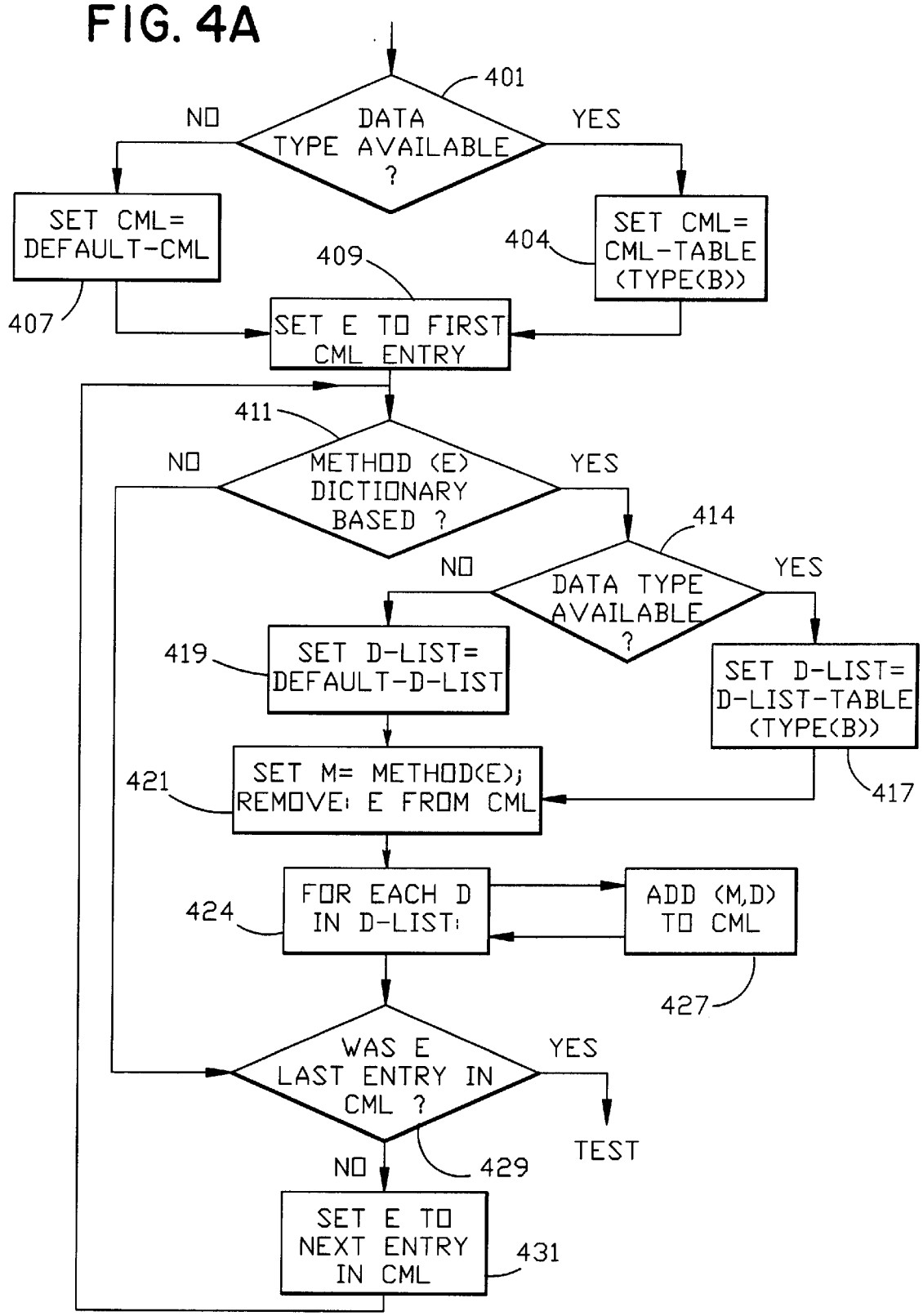
Figure 4C:
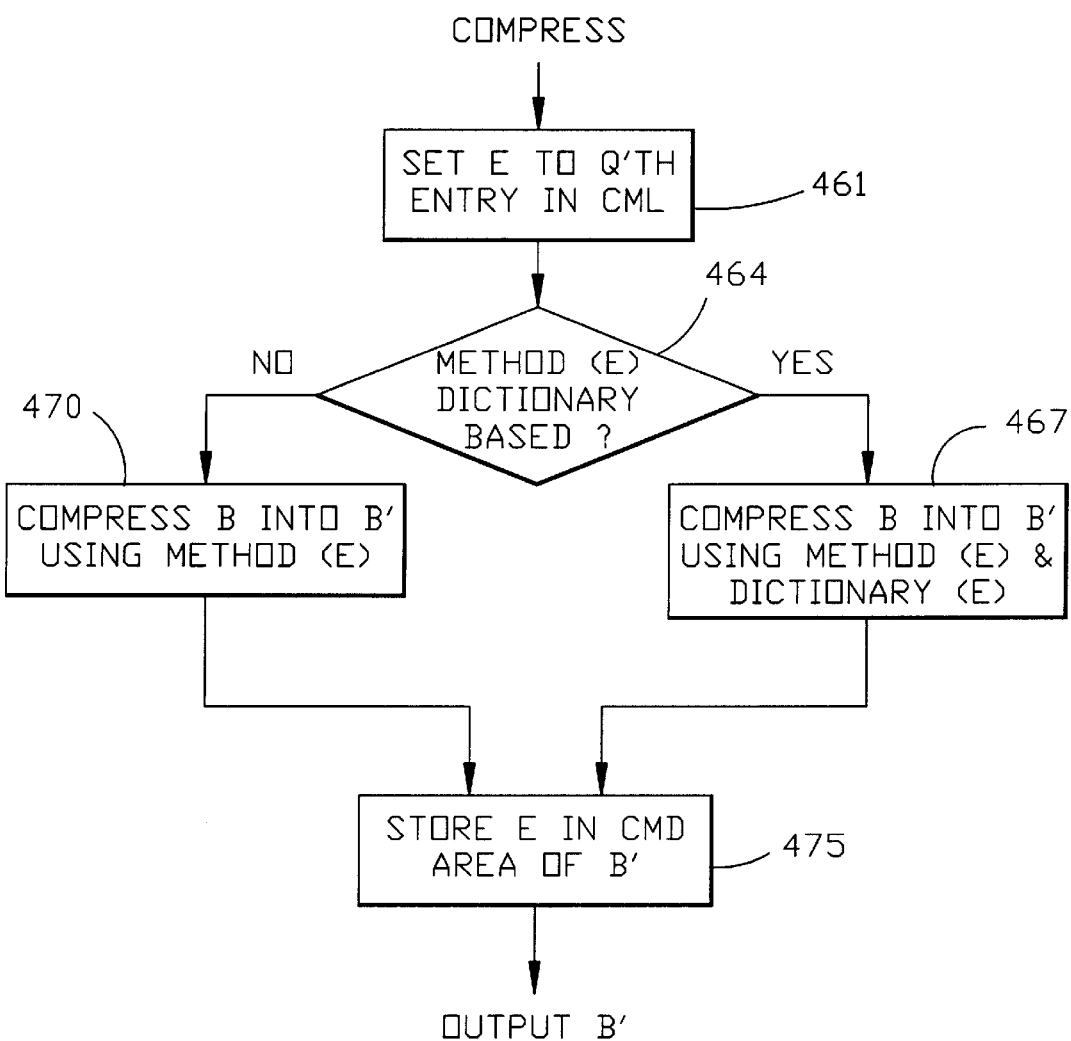

The operation of the data compressor 220 is shown in FIGS. 4A, 4B, and 4C.

In step 401, if a data type (e.g. text, image, etc.) for a given uncompressed block B is available, in step 404 the Compression Method List (CML) is set to a list of compression methods that have been preselected for that data type. Otherwise, if no data type is available, in step 407 the CML is set to a default list of compression methods.

Next, the following steps are done for each dictionary-based method M in the CML. This involves checking each entry E in the CML. First, in step 409, E is set to the first CML entry. Next, in step 411, it is determined if the method of E is dictionary-based. If it is not, step 429 is executed, where it is checked if E was the last CML entry. If it was not, in step 431 E is set to the next CML entry, and the method returns to step 411. If step 429 determines that E was the last CML entry, the loop is exited, and the method proceeds to step 434.

If the test in step 411 determines that the method of E was dictionary-based, the following steps are performed, with control passing to step 429 at the completion of these steps.

In step 414, it is determined if a data type is available (i.e the block includes a "data type" entry in the type field 205), If a data type is available, in steps 417, 421, 424, and 427, the CML is expanded by replacing E with the list (M,D1), (M,D2), . . . , (M,Dj), where (D1, . . . , Dj) is a list of dictionary block identifiers that have been preselected for the data type when using compression method M. Otherwise, if no data type is available), steps 419, 421, 424, and 427, replace E with the list (M,D1'), (M,D2'), . . . , (M,Dk'), where (D1', . . . , Dk') is a default list of dictionary block identifiers for compression method M.

Next, steps 437, 439, 441, 444, and 447, are done for each entry E of the form M or (M,D) in the CML (where the latter entry is for dictionary-based methods).

In step 434, E is set to the first entry in the CML, and I, which will be used as the entry number, is set to 1. At the completion of steps 437–447, in step 449 it is checked if E was the last CML entry. If it was not, E is set to the next CML entry and I is incremented in step 451, with control returning to block 437. Otherwise the loop is exited, with control passing to step 454.

Steps 437–447 comprise the body of the loop. Steps 437, 439, 441, and 444, apply compression method M (and dictionary D if M is dictionary-based) on a sample from B, B(b1,b2) consisting of bytes b1 through b2 consecutively in B, resulting in a compressed sample of length K bytes. Next, in step 447, the resulting compressed sample length K is saved as entry CRTT(I) in compression ratio test table CRTT, where this table is an array of integers. Note: the above compression tests are independent, and although the figure shows a sequential loop, implementations are possible in which all these tests are performed in parallel.

Next, in step 454, the smallest compressed length in the table CRTT is found, say entry CRTT(Q). In step 457, the smallest compressed length is compared against a threshold. If all uncompressed input blocks are a given fixed size, the threshold can be constant; otherwise, the threshold can be computed as a function of the input block size. For example, the threshold can be computed as a given fraction of the size of the block currently being compressed.

If step 457 determines that CRTT(Q) is not sufficiently small, in step 459 the data block B is not compressed. Otherwise, if step 457 determines that CRTT(Q) is sufficiently small, in step 461, E is set equal to the Q'th entry in the CML, where E is of the form M or (M,D). In steps 464, 467, and 470, B is compressed using M, and if M is dictionary-based, dictionary D, into a block B'. Next, in step 457, E is recorded in the CMD (compression method description) prefix area of the compressed block (B'), and the resulting block B' is output.

Figure 5:
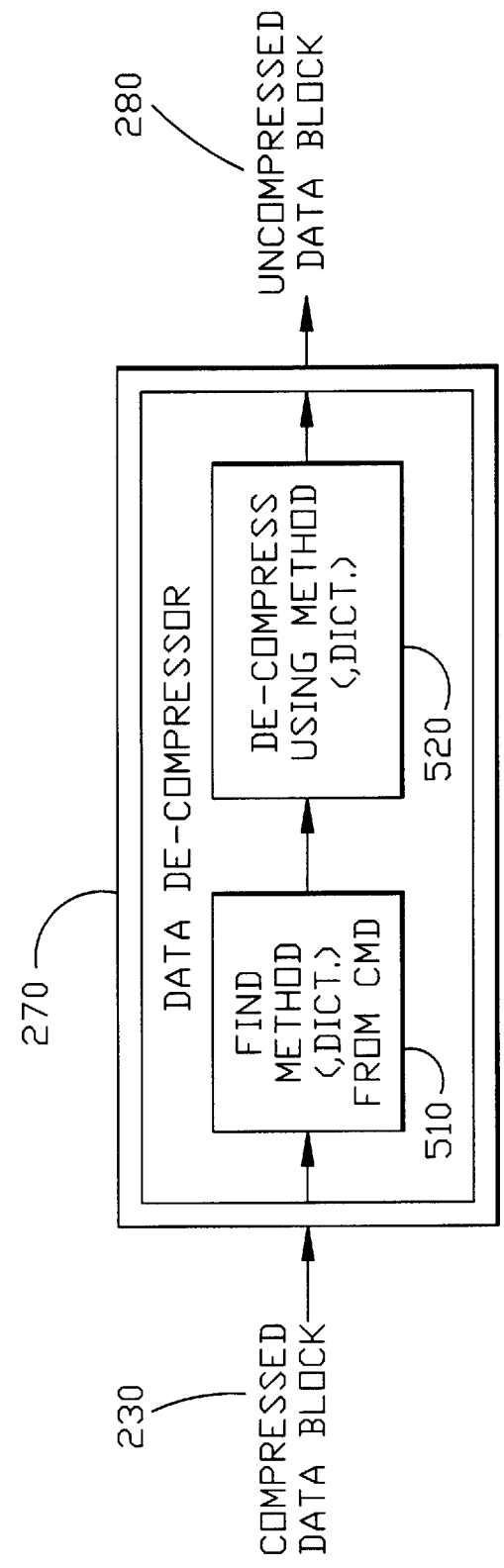
FIG. 5 shows the overall structure of the data decompressor of FIG. 2.

FIG. 5 shows the structure of the decompressor 270. Given a compressed block 230 as input, first, in block 510 the compression method used to compress the block is found (by decoding the CMD field), along with the dictionary identifier of the dictionary used if the method is dictionary based. Next, in block 520, the compression method and dictionary (if applicable) is used to decompress the block, resulting in the uncompressed data block 280 as output.

Figure 6:
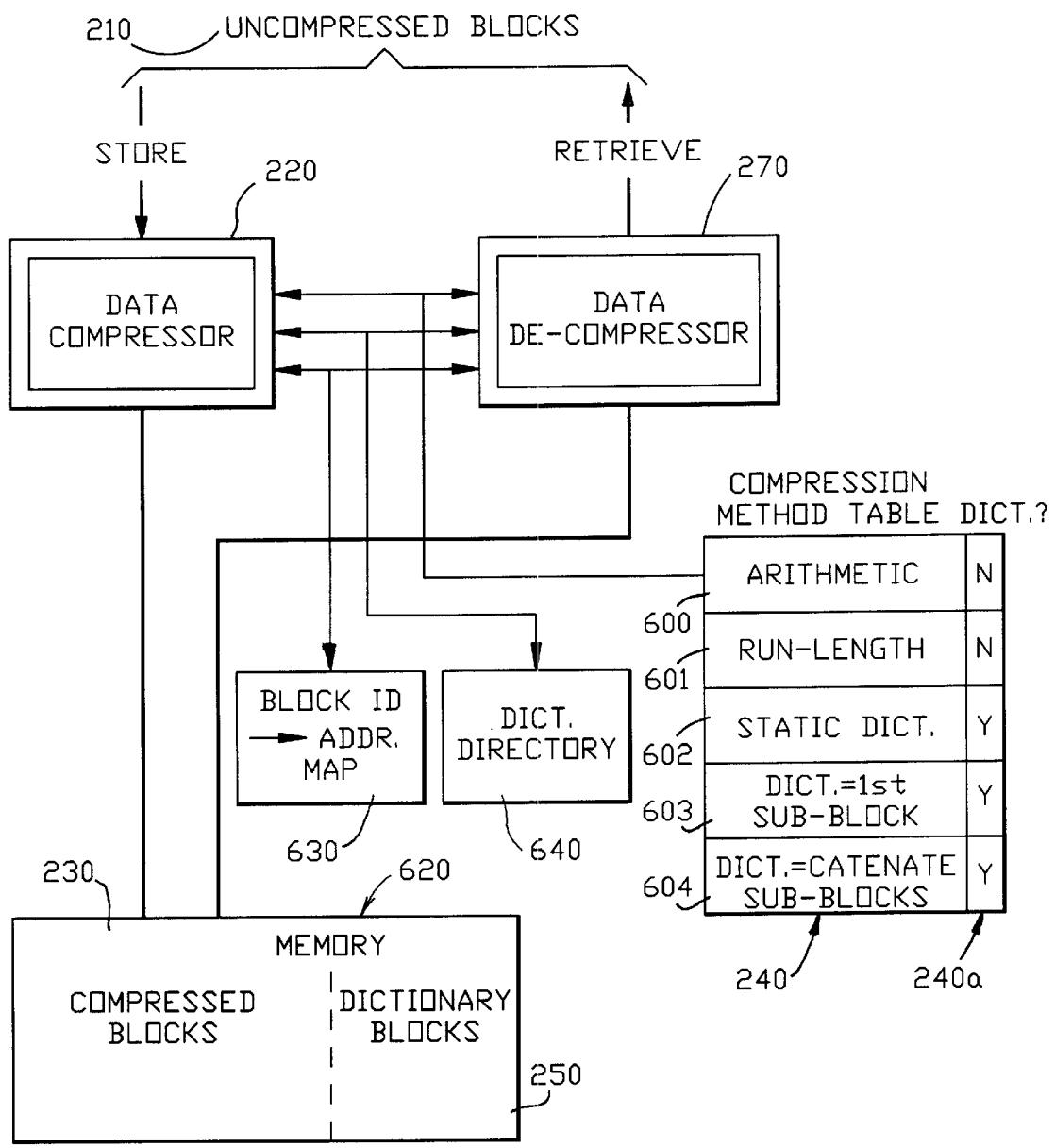
FIG. 6 shows a storage system incorporating compression & decompression in accordance with the principles of the present invention.

FIG. 6 illustrates an application of the principles of the present invention to a storage system in which there is a random access memory 620 into which arbitrary blocks of data are stored and retrieved. In order to increase the total number of bytes of uncompressed data blocks that can be stored before the memory becomes full, uncompressed blocks 210 are compressed by a data compressor 220 before being stored as compressed blocks 230, and de-compressed by a data de-compressor 270 when they are retrieved.

In this example, part of the memory 620 is used to store dictionary blocks 250. The dictionary blocks include some number of fixed, static blocks, determined before hand, and also of some number of blocks that are created and subsequently deleted in a fashion subsequently to be described.

For simplicity, assume that all uncompressed data blocks are a given fixed size, say 4096 bytes. Each such block can be considered to consist of 8 512-byte sub-blocks, for example. In some cases it may happen that using the first such sub-block as a dictionary may yield better compression than any of the fixed static dictionaries. This method is shown as 602 in the compression method table 240. Alternatively, take the first 64 bytes of each sub-block, and concatenating these into a 512-byte dictionary, could be the best dictionary for some blocks having certain phrase patterns. This method is indicated by 603 in the figure. The other three methods indicated in the figure are arithmetic coding 600, run-length coding 601, and LZ1 using one of the fixed set of static dictionaries 602.

The data compressor operates as previously described. However, if the best compression method is found to be that using the first sub-block 602 or that using a concatenation of multiple sub-blocks 603, the dictionary is stored as one of the dictionary blocks 250 at this time, the dictionary directory 640 is updated accordingly using standard techniques, and the identity of the dictionary block as given by the dictionary directory is stored in the CMD. In any case, the compressed data block 230 is stored in the memory 620, and the mapping of block identifiers to memory addresses 630 is updated using standard techniques. Conversely, the data de-compressor operates as previously described, however when a compressed block is retrieved, if it is found that either the first sub-block or concatenation of multiple sub-blocks methods was used, then if the compressed data block is also being removed from the memory, the dictionary is also removed from the set of dictionary blocks at this time.

Figure 7:
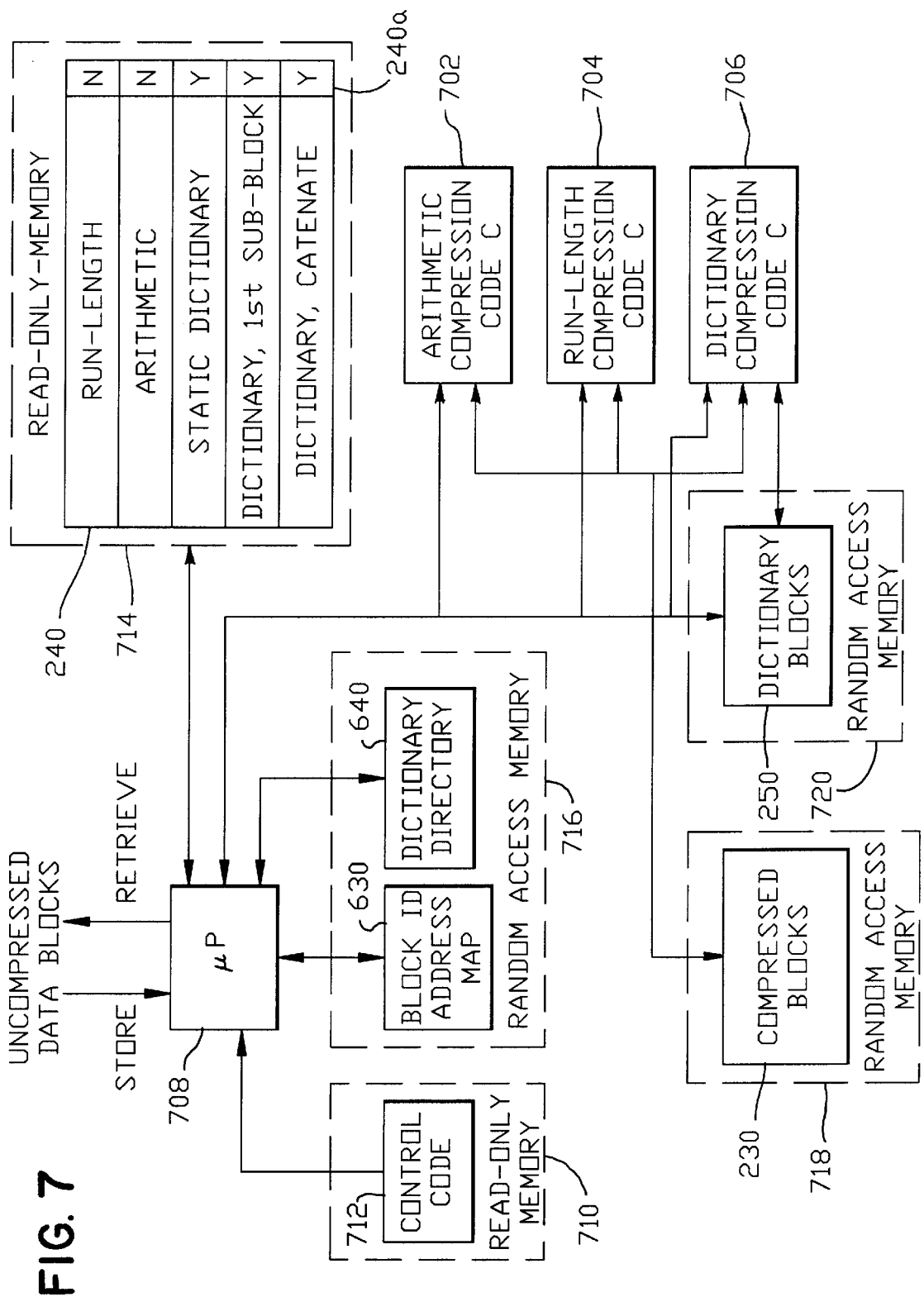
FIG. 7 is a block diagram of an encoder/decoder in a compression system, in accordance with the principles of the present invention.

FIG. 7 is a block diagram of an encoder/decoder in a compression system, in accordance with the principles of the present invention. The system of FIG. 7 includes a microprocessor (Up) 708 which controls the encoding and decoding of the data blocks under control of program code 712 stored in a read only memory 710. The program code implements the methods of FIGS. 4A–4C and the decompression of FIG. 5. The system also includes CODECs 702, 704, 706 which perform both the encoding and decoding functions as determined by control data sent from the microprocessor 708. The CODECs can be embodied in hardware logic circuits or as program code executed by microprocessor 708. The compression method table 240 is stored in a read only memory 714 which is addressed and read by the microprocessor. The block address ID map 630, the dictionary directory 640, the dictionary blocks 250 and the compressed blocks 230 are stored in random access memories 716, 718, 720 (which can be multiple memories or address spaces in a single memory).

The present system and method can be modified and extended in a number of ways. For example multiple dictionary blocks can be used as a logical single dictionary. In such an embodiment, a set of dictionary blocks, say D1, D2, . . . , Dn, can be used by a dictionary-based compression method, say Lempel-Ziv 1 (LZ1), as if the ordered set is logically a single dictionary. In this case D1, D2, . . . , Dn are considered to be catenated into a single logical dictionary D, and pointers in the compressed output refer to substrings in one of the n actual dictionary blocks.

As another modification, the set of dictionary blocks used by the compressor and de-compressor need not be fixed to a predetermined set. For example, this set could be initially empty, and dictionaries generated by a dictionary-based compression method could be added to the set as subsequent blocks are compressed, until a maximum number of dictionary blocks is reached.

Furthermore, if there are currently no compressed blocks requiring a given dictionary block for de-compression (this can be determined by examining the CMD fields), the given dictionary block can be removed from the current set of dictionary blocks.

Among other possibilities, the set of dictionary blocks could be managed using an LRU type policy: in order to add a new dictionary block, the least-recently-used dictionary block (not currently required for de-compression) could be selected to be replaced.

Although the present invention and its advantages have been described in detail, it should be understood that various changes, substitutions and alterations can be made herein without departing from the spirit and scope of the invention as defined by the appended claims.

What is claimed is:

1. A method for compressing data using a plurality of data compression mechanisms, comprising the steps of:

compressing, using said plurality of data compression mechanisms, a portion of a block of the data to select therefrom an appropriate one of the data compression mechanisms to apply to the block;

compressing the block using the selected one of the data compression mechanisms; and, providing the compressed block with an identifier of the selected one of the data compression mechanisms.

2. The method of claim 1 comprising the further step of using the identifier to identify the one of the mechanisms to be used to decompress the data.

3. The method of claim 1, wherein the data compression mechanisms are selected from at least two of a run-length encoder, an adaptive dictionary and a static dictionary.

4. The method of claim 1 wherein at least one of the data compression mechanisms comprises a dictionary.

5. The method of claim 4 wherein the dictionary is of an adaptive type.

6. A system for coding data, comprising:

a plurality of data compression mechanisms;

a memory for storing the data to be compressed;

first logic for compressing, using said plurality of data compression mechanisms, a portion of a block of the data to select therefrom an appropriate one of the data compression mechanisms to apply to the block and for routing the data to the appropriate one of the data compression mechanisms for compression; and second logic for providing each compressed block with an identifier of the selected one of the data compression mechanisms.

7. The system of claim 6 wherein the second logic comprises further includes means for providing at least some of the blocks with a field identifying a dictionary.

8. The system of claim 6 further comprising:

a plurality of decompression mechanisms; and, routing logic for using the identifier to identify the one of the mechanisms to be used to decompress the data and for routing the each data block to an appropriate one of the decompression mechanisms responsive thereto.

9. A method for decompressing data using a plurality of data decompression mechanisms, comprising:

decoding a coding identifier provided with each of a data block to select an appropriate one of the data decompression mechanisms to apply to the block, said coding identifier specifying a data compression mechanism for the block which is chosen by compressing at least a portion of the block using a plurality of data compression mechanisms to select therefrom the one appropriate data compression mechanism for the block; and, decompressing the block using the selected one of the data decompression mechanisms.

10. The method of claim 9 wherein the data compression mechanisms are selected from at least two of a run-length encoder, an adaptive dictionary and a static dictionary.

11. The method of claim 9 wherein at least one of the data decompression mechanisms comprises a dictionary.

12. The method of claim 11 wherein the dictionary is of an adaptive type.

13. A system for coding data, comprising:

a plurality of data decompression mechanisms;

a buffer for receiving blocks of the data to be decompressed, at least some of the blocks comprising multiple data elements; and logic for testing a coding identifier associated with each block to select an appropriate one of the data decompression mechanisms to apply to the block and for routing the block to the appropriate one of the data decompression mechanisms for decompression, said coding identifier specifying a data compression mechanism for the block which is chosen by compressing at least a portion of the block using a plurality of data compression mechanisms to select therefrom the one appropriate data compression mechanism for the block.

14. The system of claim 13 wherein the logic comprises means for using a portion of each block as a dictionary.

15. The system of claim 13 wherein the logic comprises means for selecting subset of each block for use as a dictionary, which yields the best compression.

16. The method of claim 1, wherein said plurality of data compression mechanisms comprises a set of dictionaries and further comprising modifying said set of dictionaries prior to compressing subsequent data blocks.

17. The method of claim 9, wherein said plurality of data decompression mechanisms comprises a set of dictionaries and further comprising modifying said set of dictionaries prior to decompressing subsequent data blocks.

* * * * *